United States Patent
Yoo et al.

(10) Patent No.: US 10,879,491 B1
(45) Date of Patent: Dec. 29, 2020

(54) DISPLAY APPARATUS HAVING AN INORGANIC ENCAPSULATING LAYER WITH A ROUGH SURFACE AND METHOD OF MANUFACTURING THE SAME

(71) Applicant: SAMSUNG DISPLAY CO., LTD., Yongin-si (KR)

(72) Inventors: Inkyung Yoo, Yongin-si (KR); Heena Kim, Yongin-si (KR); Youngseok Baek, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/861,742

(22) Filed: Apr. 29, 2020

(30) Foreign Application Priority Data

Aug. 13, 2019 (KR) .................. 10-2019-0098926

(51) Int. Cl.
*H01L 51/52* (2006.01)
*H01L 27/32* (2006.01)
*H01L 51/56* (2006.01)
*H01L 51/00* (2006.01)

(52) U.S. Cl.
CPC ...... *H01L 51/5253* (2013.01); *H01L 27/3244* (2013.01); *H01L 51/0096* (2013.01); *H01L 51/56* (2013.01); *H01L 2227/323* (2013.01)

(58) Field of Classification Search
CPC . H01L 51/5253; H01L 51/56; H01L 51/0096; H01L 27/3244; H01L 2227/323
See application file for complete search history.

(56) References Cited

U.S. PATENT DOCUMENTS

| 5,300,788 | A | * | 4/1994 | Fan | G02B 27/0093 257/13 |
| 8,466,459 | B2 | * | 6/2013 | Chang | H01L 27/3246 257/40 |
| 2008/0030661 | A1 | * | 2/2008 | Tung | G02F 1/133555 349/114 |

(Continued)

FOREIGN PATENT DOCUMENTS

| KR | 10-2017-0111827 | 10/2017 |
| KR | 10-2018-0112203 | 10/2018 |

(Continued)

*Primary Examiner* — John P. Dulka
(74) *Attorney, Agent, or Firm* — F. Chau & Associates, LLC

(57) ABSTRACT

A display apparatus includes a substrate including a first area, a second area surrounding the first area, and a third area between the first area and the second area. A plurality of display elements disposed in the second area include a first display element and a second display element spaced apart from each other. A thin-film encapsulation layer includes an organic encapsulation layer covering the plurality of display elements. An inorganic encapsulation layer is on the organic encapsulation layer. A planarization layer partially covers the thin-film encapsulation layer in the third area. The inorganic encapsulation layer includes a first surface facing the planarization layer and a second surface facing in an opposite direction. The first surface has a roughness that is greater than a roughness of the second surface. In addition, other various embodiments may be provided.

20 Claims, 11 Drawing Sheets

(56) References Cited

U.S. PATENT DOCUMENTS

| | | | |
|---|---|---|---|
| 2012/0300304 A1* | 11/2012 | Gollier | C03C 21/002 359/599 |
| 2015/0372011 A1* | 12/2015 | Zhang | G02F 1/134363 257/72 |
| 2017/0287992 A1 | 10/2017 | Kwak et al. | |
| 2018/0157362 A1* | 6/2018 | Kim | G06F 3/041 |
| 2018/0286938 A1 | 10/2018 | Moon et al. | |
| 2019/0012031 A1* | 1/2019 | Kim | H01L 27/322 |
| 2019/0013374 A1* | 1/2019 | Park | H01L 27/3265 |
| 2020/0136088 A1* | 4/2020 | Yang | H01L 27/3246 |
| 2020/0144539 A1* | 5/2020 | Park | H01L 51/5253 |
| 2020/0212139 A1* | 7/2020 | Baek | H01L 27/3244 |

FOREIGN PATENT DOCUMENTS

| | | |
|---|---|---|
| KR | 10-2018-0063633 | 1/2019 |
| KR | 10-2019-0004892 | 1/2019 |
| KR | 10-2019-0006618 | 1/2019 |

\* cited by examiner

DISPLAY APPARATUS HAVING AN INORGANIC ENCAPSULATING LAYER WITH A ROUGH SURFACE AND METHOD OF MANUFACTURING THE SAME

CROSS-REFERENCE TO RELATED APPLICATION

This application claims the benefit of Korean Patent Application No. 10-2019-0098926, filed on Aug. 13, 2019, in the Korean Intellectual Property Office, the disclosure of which is incorporated by reference herein in its entirety.

TECHNICAL FIELD

The present disclosure relates to a display apparatus and, more specifically, to a display apparatus having an inorganic encapsulating layer with a rough surface and a method of manufacturing the same.

DISCUSSION OF THE RELATED ART

As display apparatuses are finding a variety of new uses in modern electronic devices, the sizes and shapes of display devices has diversified. In addition, display apparatuses have become thinner and lighter.

Display devices generally include a display area in which an image is displayed and a non-display area in which no image is displayed. As display devices advance, the display area is becoming bigger and the non-display area is becoming smaller. Additionally, various functional elements have been incorporated into display apparatuses.

SUMMARY

A display apparatus includes a substrate including a first area, a second area at least partially surrounding the first area, and a third area disposed between the first area and the second area. A plurality of display elements are disposed in the second area and the plurality of display elements includes a first display element and a second display element spaced apart from each other. A thin-film encapsulation layer including an organic encapsulation layer at least partially covers the plurality of display elements, and an inorganic encapsulation layer on the organic encapsulation layer. A planarization layer partially covers the thin-film encapsulation layer in the third area. The inorganic encapsulation layer includes a first surface facing the planarization layer and a second surface facing in a direction opposite to the first surface. The first surface has a roughness that is greater than a roughness of the second surface.

The planarization layer may include a material identical to a material of the organic encapsulation layer.

A root-mean-square (RMS) roughness of the first surface may be equal to or greater than about 25 Å and equal to or less than about 35 Å.

A taper angle of an end of the planarization layer may be equal to or greater than about 0° and equal to or less than about 15°.

The planarization layer may be formed by an ink-jet printing method.

The planarization layer and/or the organic encapsulation layer may include an acrylic-based resin, a methacrylic-based resin, an isoprene-based resin, a vinyl-based resin, an epoxy-based resin, a urethane-based resin, a cellulose-based resin, a perylene-based resin, an imide-based resin, or a compound of two or more of these resins.

The display apparatus may further include a partition wall disposed between the first display element and the second display element in the third area. The planarization layer may cover the partition wall.

The substrate may include an opening disposed in the first area.

The display apparatus may further include at least one groove in the third area. The planarization layer may cover the at least one groove.

Each of the first display element and the second display element may include a pixel electrode, an opposite electrode, and an intermediate layer disposed between the pixel electrode and the opposite electrode. The opposite electrode and/or an organic material layers included in the intermediate layer may extend toward the third area and may be disconnected or separated by the at least one groove.

The display apparatus may further include a separator disposed in the third area and having a reverse-tapered inclined surface. Each of the first display element and the second display element includes a pixel electrode, an opposite electrode, and an intermediate layer between the pixel electrode and the opposite electrode. The opposite electrode and/or an organic material layer included in the intermediate layer extends toward the third area and is disconnected or separated by the separator.

A display apparatus includes a first area, a second area at least partially surrounding the first area, and a third area disposed the first area and the second area. A method for forming the display apparatus includes forming a plurality of display elements in a position corresponding to the second area of a substrate. A thin-film encapsulation layer including an organic encapsulation layer and an inorganic encapsulation layer is formed on the organic encapsulation layer to at least partially cover the plurality of display elements. A surface treatment is performed on an upper surface of the inorganic encapsulation layer by using plasma. A planarization layer is formed in the third area by using an ink-jet printing method.

The inorganic encapsulation layer may include a first surface facing the planarization layer and a second surface facing in a direction opposite to the first surface, and the first surface may have a roughness that is greater than a roughness of the second surface.

An RMS roughness of the first surface may be equal to or greater than about 25 Å and equal to or less than about 35 Å.

An end of the planarization layer may be formed such that that a taper angle of an inclined surface is equal to or greater than about 0° and equal to or less than about 15°.

The planarization layer may include an acrylic-based resin, a methacrylic-based resin, an isoprene-based resin, a vinyl-based resin, an epoxy-based resin, a urethane-based resin, a cellulose-based resin, a perylene-based resin, an imide-based resin, or a compound of two or more of these resins.

The planarization layer may include a material identical to a material of the organic encapsulation layer.

The method may further include forming an opening in the substrate to correspond to the first area.

The forming of the opening may be performed after the forming of the planarization layer is performed.

The forming of the opening may include radiating an outer portion of the first area with laser light.

The planarization layer may be disposed in the third area.

The method may further include forming at least one partition wall, in a position corresponding to the third area, before the forming of the thin-film encapsulation layer is performed.

The forming of the planarization layer may include forming of the planarization to cover the at least one partition wall.

Before the forming of the thin-film encapsulation layer is performed, at least one groove and/or at least one separator may be formed in the position corresponding to the third area.

The planarization layer may cover the at least one groove and/or the at least one separator.

BRIEF DESCRIPTION OF THE DRAWINGS

The above and other aspects, features, and elements of exemplary embodiments of the present disclosure will be more apparent from the following description taken in conjunction with the accompanying drawings, in which.

DETAILED DESCRIPTION

Figure 1:
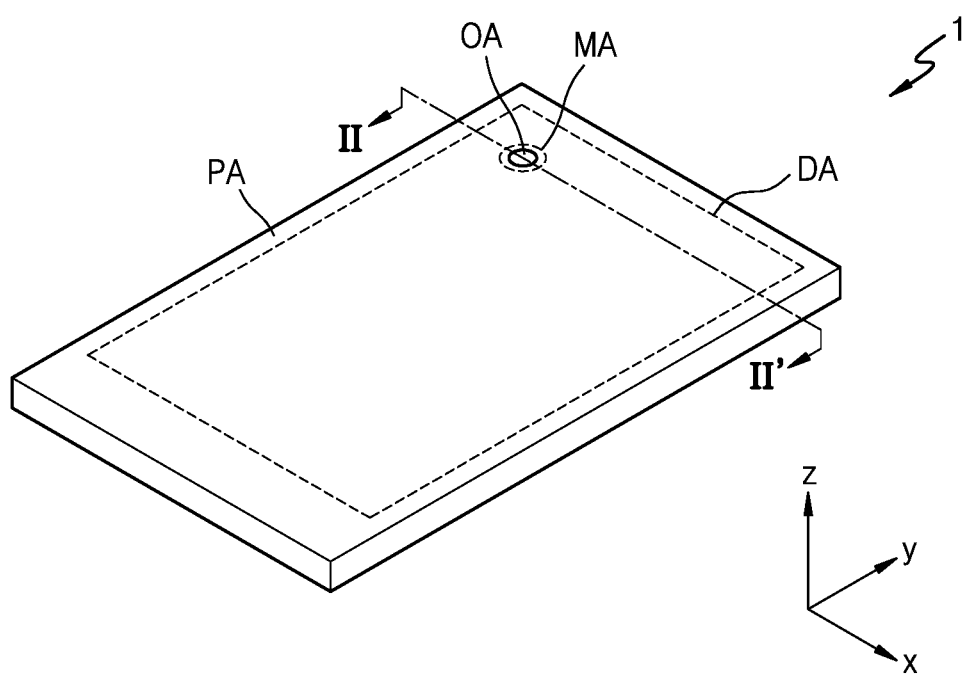
FIG. 1 is a schematic perspective view illustrating a display apparatus according to an exemplary embodiment of the present disclosure.

Reference will now be made in detail to exemplary embodiments of the present invention, with reference to the accompanying drawings. Like reference numerals may refer to like elements throughout the specification and the figures. In this regard, the present embodiments may have different forms and should not be construed as being limited to the descriptions set forth herein. As used herein, the term "and/or" includes any and all combinations of one or more of the associated listed items.

Hereinafter, exemplary embodiments of the present disclosure will be described in detail with reference to the attached drawings. To the extent that an element is not described with respect to a particular figure, it may be assumed that the element is at least similar to corresponding elements that have been discussed elsewhere in the specification.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. In contrast, the term "consisting of" used herein specifies the presence of stated features or components, alone, without the inclusion of other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. While the relative sizes and angles shown in the figures are intended to illustrate a particular exemplary arrangement, the following embodiments are not limited thereto.

When a certain embodiment may be implemented differently, a specific process order may be different from a described one. For example, two processes that are consecutively described may be performed substantially at the same time or performed in an order other than the described order.

It will be understood that when a layer, region, or component is referred to as being "connected to" or "coupled to" another layer, region, or component, it may be "directly connected or coupled" to the other layer, region, or component, and/or "indirectly connected to" the other layer, region, or component with intervening elements therebetween. For example, when a layer, region, or component is referred to as being electrically "connected to" or "coupled to" another layer, region, or component, it may be electrically "directly connected or coupled" to the other layer, region, or component, and/or electrically "indirectly connected to" the other layer, region, or component with intervening elements therebetween.

In the following examples, the x-axis, the y-axis and the z-axis are not limited to the three axes of a Cartesian coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display apparatus 1 according to an exemplary embodiment of the present disclosure.

Referring to FIG. 1, the display apparatus 1 includes a first area OA, a second area DA at least partially surrounding the first area OA, and a third area MA disposed between the first area OA and the second area DA and at least partially surrounding the first area OA. For example, the first area OA may be referred to as a component area, a sensor area, or an opening area. In addition, the second area DA may be referred to as a display area. The third area MA may be referred to as an intermediate area. In the present specification, the first area OA, the second area DA, and the third area MA included in the display apparatus 1 may be respectively understood as the first area OA, the second area DA, and the third area MA included in a substrate of the display apparatus 1.

The display apparatus 1 may generate a certain image by using light emitted from a plurality of pixels disposed in the second area DA.

As shown in FIG. 1, in the display apparatus 1, according to an exemplary embodiment of the present disclosure, the first area OA may be disposed to be entirely surrounded by the second area DA. According to an exemplary embodiment of the present disclosure, the first area OA may be partially surrounded by the second area DA.

The first area OA may include an area having a great light transmittance (e.g. transparent) in correspondence with a component included in the display apparatus 1. For example, the first area OA may be understood as a transmission area via which light may be transmitted, wherein the light (and in particular, the generated image) is visible therethrough.

The third area MA may be disposed between the first area OA and the second area DA. In addition, the second area DA may be disposed between a fourth area PA that is an outer area of the display apparatus 1 and the third area MA. For example, the first area OA may be entirely surrounded by the third area MA, the third area MA may be entirely surrounded by the second area DA, and the second area DA may be entirely surrounded by the fourth area PA. The third area MA, the first area OA, and the fourth area PA may correspond to a non-display area in which pixels are not disposed.

FIG. 1 shows a structure in which one first area OA is disposed at a side (e.g. an upper left side) in the second area DA having a substantially rectangular shape. However, the present disclosure is not limited thereto. For example, the display area DA may have a shape of a circle, an oval, or a polygon such as a triangle, a pentagon, etc. A position and/or the number of first areas OA may also be variously modified. For example, the first area OA may be disposed in an upper central portion with reference to a plane of the second area DA (e.g.: an x-y plane). Alternatively, a plurality of first areas OA may be included in the second area DA.

Hereinafter, an organic light-emitting display apparatus is described as an example of the display apparatus 1 according to an exemplary embodiment of the present disclosure. However, the display apparatus 1 in the present disclosure is not limited to thereto. For example, in an exemplary embodiment of the present disclosure, the display apparatus 1 may include a liquid-crystal display apparatus, an inorganic light-emitting display apparatus (or an inorganic electroluminescent (EL) display apparatus), or a quantum-dot light-emitting display apparatus. For example, an emission layer of a display element in the display apparatus 1 may include an organic material, an inorganic material, a quantum dot, an organic material and a quantum dot, or an inorganic material and a quantum dot.

Figure 2:
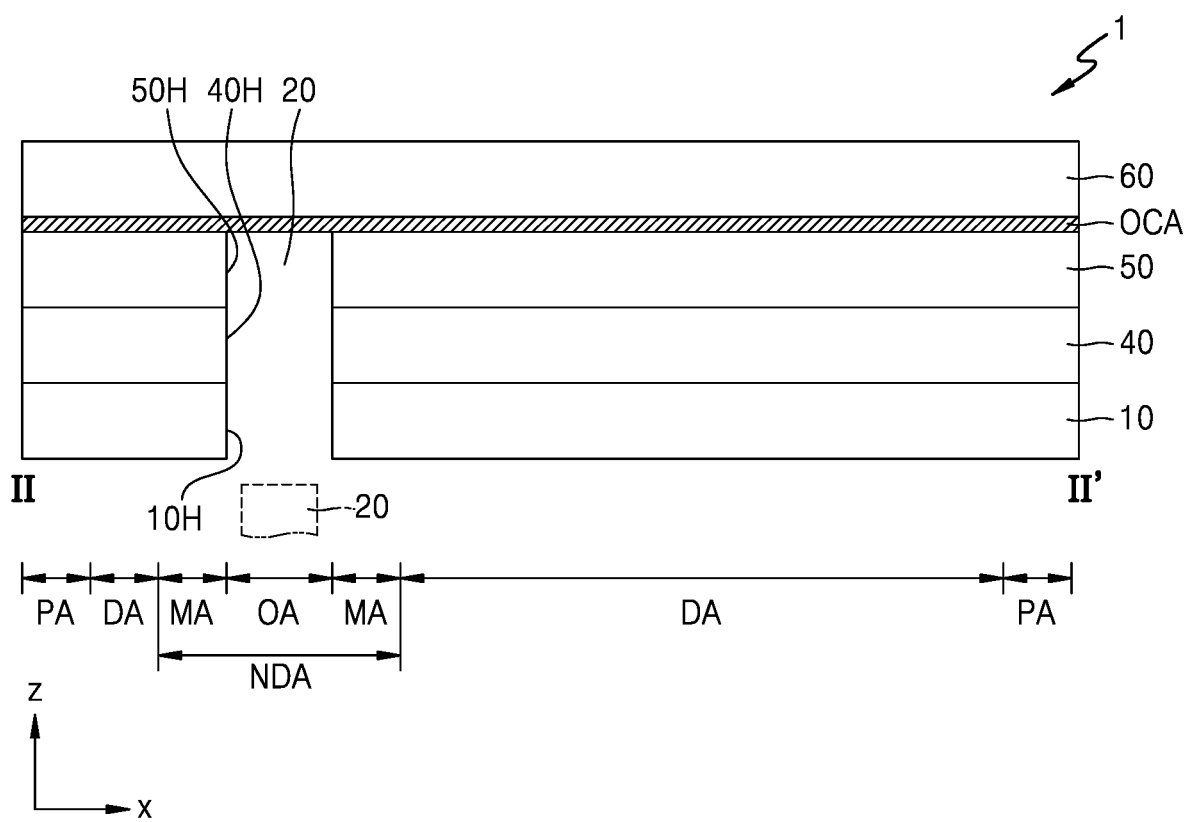
FIG. 2 is a schematic cross-sectional view illustrating the display apparatus according to an exemplary embodiment of the present disclosure.

FIG. 2 is a schematic cross-sectional view of the display apparatus 1 according to an exemplary embodiment of the present disclosure. For example, FIG. 2 may correspond to the display apparatus 1 taken along a line II-II' of FIG. 1.

Referring to FIG. 2, the display apparatus 1 may include a display panel 10, an input sensing layer 40 on the display panel 10, and an optical functional layer 50, each being covered by a window 60. The window 60 may be adhered with an element therebelow, e.g., the optical functional layer 50 via an adhesive layer such as an optical clear adhesive (OCA). The display apparatus 1 may be various types of an electronic device such as a mobile phone, a notebook computer, a smart watch, or the like.

The display panel 10 may output an image through light output from pixels. For example, the display panel 10 may include a plurality of pixels in the second area DA. Each of the pixels may include a display element and a pixel circuit connected to the display element. The display element may include, for example, an organic light-emitting diode or a quantum-dot organic light-emitting diode.

The input sensing layer 40 may obtain coordinate information according to an external input, for example, a touch event. The input sensing layer 40 may include a sensing electrode (or a touch electrode) and trace lines connected to the sensing electrode. The input sensing layer 40 may be disposed on the display panel 10. The input sensing layer 40 may sense an external input by using a mutual cap method or a self-cap method.

In an exemplary embodiment of the present disclosure, the input sensing layer 40 may be formed separately from the display panel 10, and then, adhered to the display panel 10 via an adhesive layer such as an OCA. In an exemplary embodiment of the present disclosure, the input sensing layer 40 may be formed directly on the display panel 10. For example, the input sensing layer 40 may be formed on the display panel 10 sequentially after a process of forming the display panel 10 is performed. In this case, the input sensing layer 40 may be understood as a portion of the display panel 10, and the adhesive layer might not be disposed between the input sensing layer 40 and the display panel 10. As shown in FIG. 2, the input sensing layer 40 may be disposed between the display panel 10 and the optical functional layer 50. However, in an exemplary embodiment of the present disclosure, the input sensing layer 40 may be disposed on the optical functional layer 50.

The optical functional layer 50 may include a reflection prevention layer. The reflection prevention layer may reduce reflectivity of light incident toward the display panel 10 from outside via the window 60. The reflection prevention layer may include a retarder and a polarizer.

The retarder may be a film-type retarder or a liquid-crystal coating type retarder. The retarder may include a $\lambda/2$ (half wave) retarder and/or $\lambda/4$ (quarter wave) retarder. The polarizer may be a film-type polarizer or a light-crystal coating type polarizer. The film-type polarizer may include a stretched synthetic resin film. The liquid-crystal coating type polarizer may include liquid crystals disposed in a particular arrangement.

The retarder and the polarizer may further include a protective film. For example, the retarder, the polarizer, or the protective film may be defined as a base layer of the reflection prevention layer.

In an exemplary embodiment of the present disclosure, the reflection prevention layer may include a black matrix and color filters. The color filters may be disposed in consideration of a color of light emitted from each of the pixels of the display panel 10.

In an exemplary embodiment of the present disclosure, the reflection prevention layer may include a destructive interference structure. The destructive interference structure may include a first reflective layer and a second reflective layer disposed on different layers. First reflected light and second reflected light reflected from the first reflective layer and the second reflective layer, respectively, may be destructively interfered, and thus, reflectivity of external light may be reduced.

The optical functional layer 50 may include a lens layer. The lens layer may enhance light-emitting efficiency of light emitted from the display panel 10, or reduce a color deviation. The lens layer may include a layer having a concave or convex lens shape, and/or may include a plurality of layers having different refractive indexes. The optical functional layer 50 may include both the reflection prevention layer and the lens layer, or either the reflection prevention layer or the lens layer.

In an exemplary embodiment of the present invention, the optical functional layer 50 may be formed consecutively after a process of forming the display panel 10 and/or the input sensing layer 40 is performed. In this case, an adhesive layer might not be disposed between the optical functional layer 50, the display panel 10, and/or the input sensing layer 40.

The display panel 10, the input sensing layer 40, and/or the optical functional layer 50 may include an opening corresponding to the first area OA. In relation to this, FIG. 2 illustrates a structure in which the display panel 10, the input sensing layer 40, and the optical functional layer 50 include first to third openings 10H, 40H, and 50H, respectively, and the first to third openings 10H, 40H, and 50H overlap each other.

In an exemplary embodiment of the present disclosure, the display panel 10, the input sensing layer 40, and/or the optical functional layer 50 might not include an opening. For example, one or two elements from among the display panel 10, the input sensing layer 40, and the optical functional layer 50 might not include an opening. Alternatively, the display panel 10, the input sensing layer 40, and the optical functional layer 50 might each not include an opening.

The first area OA may correspond to an area in which a component 20 (e.g.: a sensor, a camera, a speaker, etc.) is disposed.

The component 20 may include an electronic element. For example, the component 20 may be an electronic element using light or sound. For example, the component 20 may include a sensor configured to output and/or receive light, such as an infrared sensor, a camera configured to receive light and capture an image, a sensor configured to measure a distance or recognize a fingerprint by outputting and sensing light or sound, a small lamp configured to output light, a speaker configured to output sound, or the like. In the case of the electronic element using light, light in various wavelength bands, such as visible light, infrared light, ultraviolet light, etc. may be used.

In an exemplary embodiment of the present disclosure, when the display apparatus 1 is used as a smart watch or a vehicle dashboard, the component 20 may be a member such as a clock hand or a needle indicating certain information (e.g., a vehicle speed, etc.). When the display apparatus 1 includes the clock hand or the vehicle dashboard, the component 20 may pass through the window 60 and be exposed to the outside. In this case, unlike what is shown in FIG. 2, the window 60 may include an opening corresponding to the first area OA.

As described above, the component 20 may include an element (elements) related to a function of the display panel 10 or an accessory enhancing a sense of beauty of the display panel 10.

FIGS. 3A to 3F are cross-sectional views sequentially illustrating a method of manufacturing a display apparatus according to an exemplary embodiment of the present invention.

According to an exemplary embodiment of the present invention, the display apparatus may include the second area DA that is a display area, and a non-display area NDA that is an area other than the second area DA. For example, the non-display area NDA may include the first area OA and the third area MA, each shown in FIG. 1.

Figure 3A:
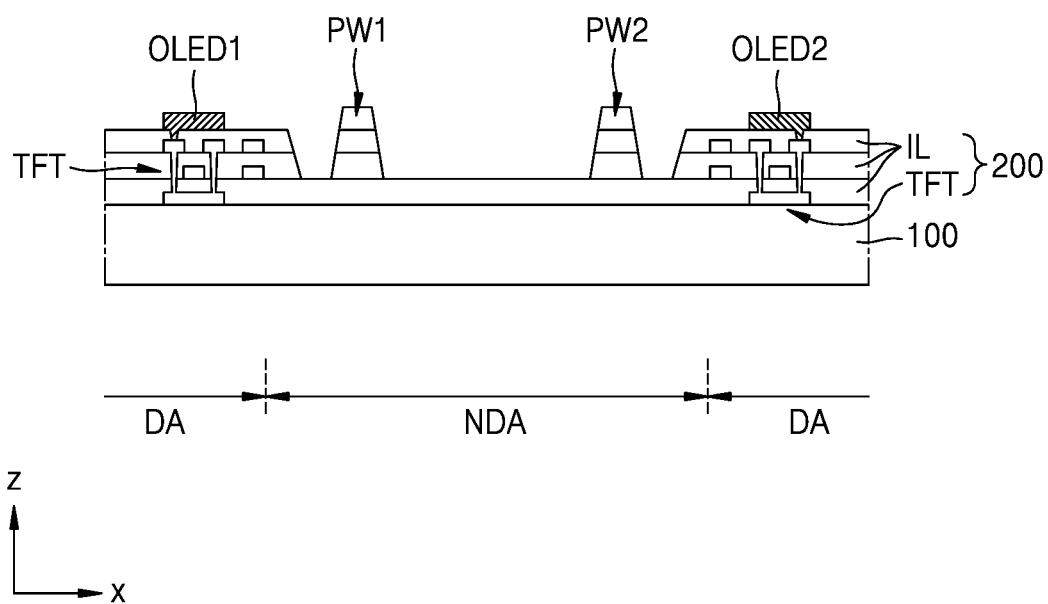
FIGS. 3A to 3F are cross-sectional views sequentially illustrating a method of manufacturing the display apparatus according to an exemplary embodiment of the present disclosure.

Referring to FIG. 3A, the method of manufacturing the display apparatus may include forming of a plurality of display elements at a position corresponding to the second area DA of the substrate 100.

The display elements may include a first display element OLED1 and a second display element OLED2. The first display element OLED1 and the second display element OLED2 are display elements neighboring each other, and may be spaced apart from each other. The non-display area NDA of FIGS. 3A-3F may correspond to an area in which the first area OA and the third area MA, each shown in FIG. 1, are to be formed by performing sequential operations to be described later with reference to FIGS. 3A to 3F.

A circuit layer 200 and at least one insulating layer IL may be disposed on the substrate 100, wherein the circuit layer 200 includes a thin-film transistor TFT and the at least one insulating layer IL is disposed between the first and second display elements OLED1 and OLED2. The first and second display elements OLED1 and OLED2 may be disposed on the circuit layer 200. The circuit layer 200 may include wires providing a signal or voltage to a storage capacitor and the display elements.

The substrate 100 may include glass or a polymer resin. The polymer resin may include polyethersulphone, polyarylate, polyetherimide, polyacrylate, polyethylene naphthalate, polyethylene terephthalate, polyphenylene sulfide, polyimide, polycarbonate (PC), cellulose triacetate (TAC), cellulose acetate propionate, or the like. The substrate 100 including the polymer resin may include a flexible, rollable, or bendable characteristic, e.g. the ability to be stretched, rolled, or bent without causing damage thereto. The substrate 100 may have a multi-layered structure that includes a layer including the polymer resin described above, and an inorganic layer.

In the forming of the first and second display elements OLED1 and OLED2 on the substrate 100, at least one partition wall of the first and second partition walls PW1 and PW2 may be formed together with the first and second display elements OLED1 and OLED2. The first and second partition wall PW1 and PW2 may be disposed in the non-display area NDA between the first display element OLED1 and the second display element OLED2.

The first and second partition wall PW1 and PW2 may include a plurality of insulating layers that are sequentially stacked. For example, the first and second partition wall PW1 and PW2 may be formed of a material identical to at least some of elements of the at least one insulating layer IL between the first and second display elements OLED1 and OLED2 and the substrate 100 in a process identical to a process of forming the at least some of the elements of the insulating layer IL.

Figure 3B:
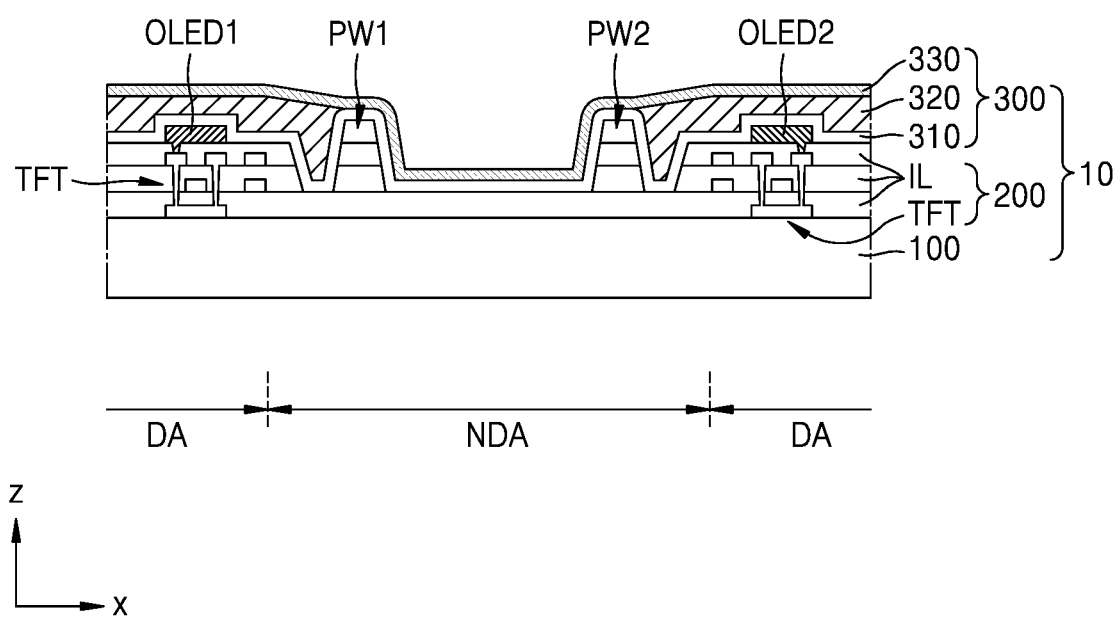

Then, in FIG. 3B, a thin-film encapsulation layer 300 covering a plurality of display elements may be formed.

Referring to FIG. 3B, the thin-film encapsulation layer 300 may include at least one inorganic encapsulation layer and at least one organic encapsulation layer 320. For example, as shown in FIG. 3B, the thin-film encapsulation layer 300 may include a first inorganic encapsulation layer 310 covering the first and second display elements OLED1 and OLED2, the organic encapsulation layer 320 on the first inorganic encapsulation layer 310, and a second inorganic encapsulation layer 330 on the organic encapsulation layer 320.

The first inorganic encapsulation layer 310 and the second inorganic encapsulation layer 330 may each include at least one inorganic insulation material such as aluminum oxide, titanium oxide, tantalum oxide, hafnium oxide, zinc peroxide, silicon oxide, silicon nitride, and/or silicon oxynitride. The organic encapsulation layer 320 may include a polymer-based material. The polymer-based material may include an acrylic-based resin, a methacrylic-based resin, an isoprene-based resin, a vinyl-based resin, an epoxy-based resin, a urethane-based resin, a cellulose-based resin, a perylene-based resin, an imide-based resin, or a compound of two or more thereof.

Figure 3C:
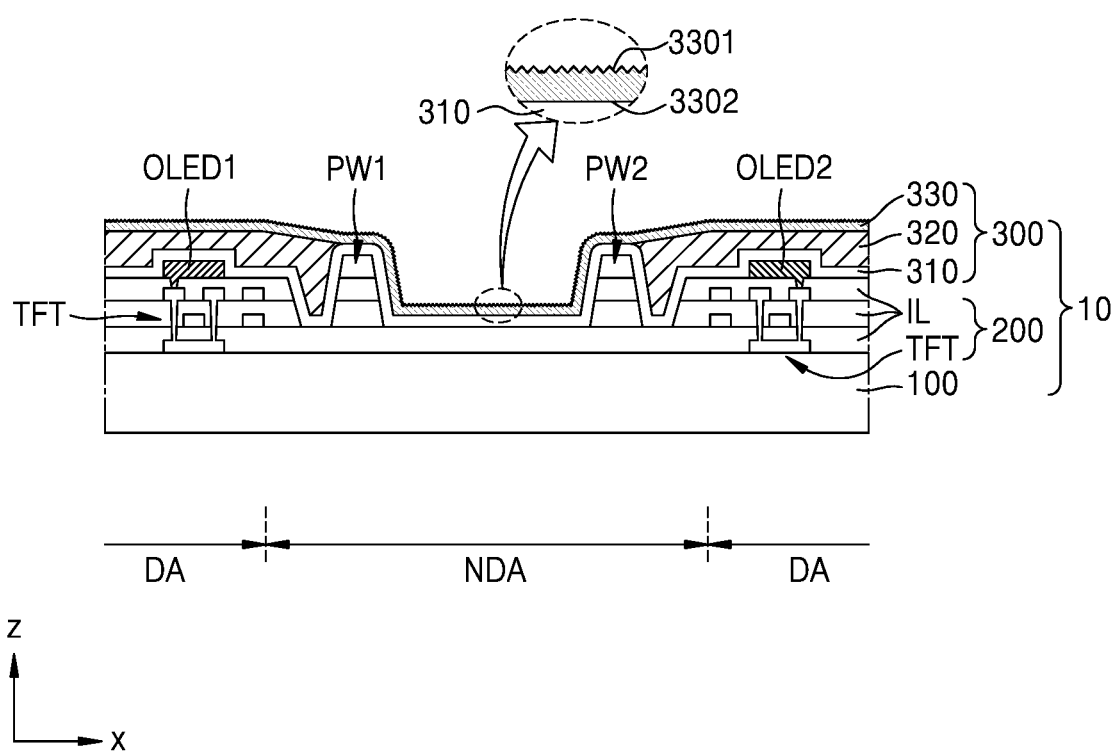

Referring to FIG. 3C, a surface-treatment process may be performed on an upper surface of the thin-film encapsulation layer 300. An inorganic encapsulation layer constituting an upper surface of the thin-film encapsulation layer 300, e.g., an upper surface 3301 of the second inorganic encapsulation layer 330 may be treated so as to be more rough than it was prior to the treatment. This treatment may be a surface treatment process using plasma (e.g.: an ashing process). For example, before a first surface that is the upper surface 3301 of the second inorganic encapsulation layer 330 goes through the surface treatment process of FIG. 3C, the first surface may have a root-mean-square (RMS) roughness value less than 20 Å. After the first surface goes through the surface treatment process of FIG. 3C, the first surface may have an RMS roughness value equal to or greater than about 25 Å and equal to or less than about 35 Å.

It is to be understood, that as used, herein, "roughness" means a quantification of how uneven and not-smooth a surface is finished. Roughness may be herein quantified as the average value of the departures from a centerline of a surface thickness through a prescribed sampling length, which may be expressed as a root-mean-square (RMS) value.

For example, after the first surface that is the upper surface 3301 of the second inorganic encapsulation layer 330 goes through the surface treatment process of FIG. 3C, the first surface may have a roughness value greater than a roughness value of a second surface that is a lower surface 3302 of the second inorganic encapsulation layer 330.

Figure 3D:
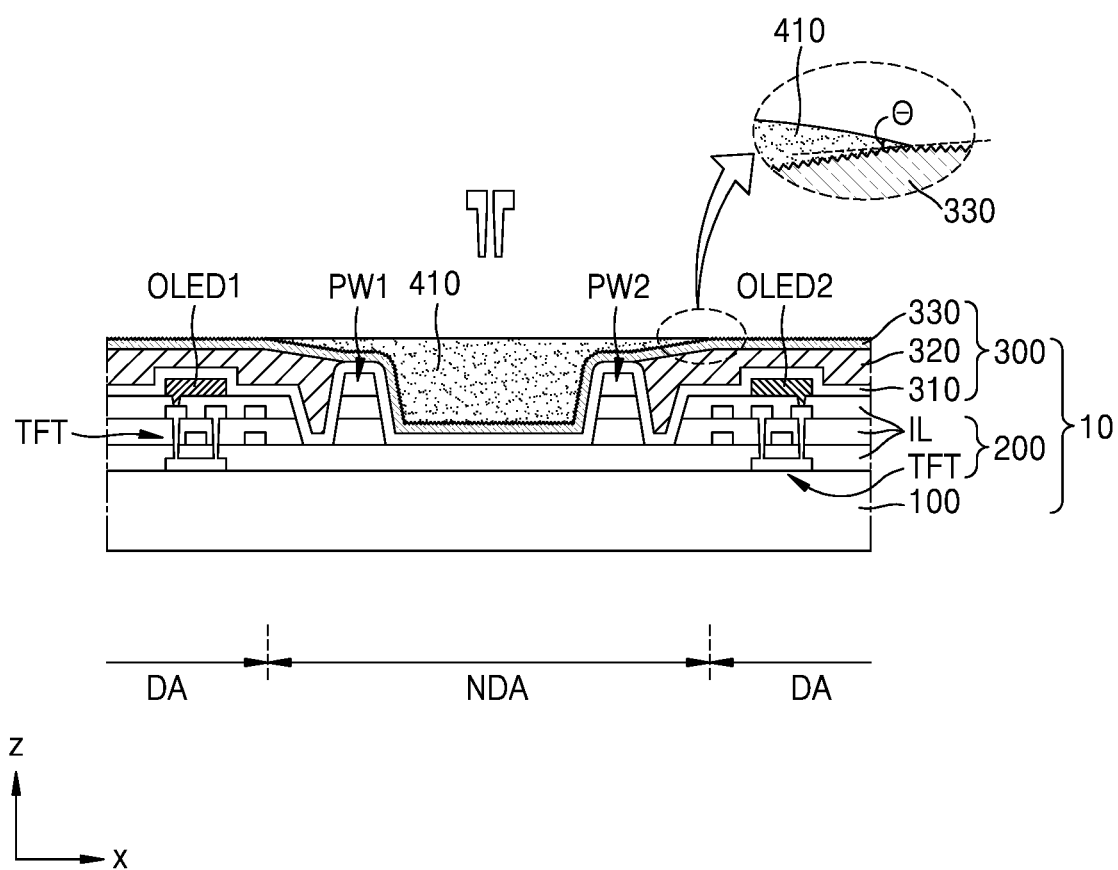

Then, referring to FIG. 3D, a planarization layer 410 may be formed at a position corresponding to the non-display area NDA by using an ink-jet printing method.

The planarization layer 410 may cover the non-display area NDA between the plurality of display elements, for example, the first display element OLED1 and the second display element OLED2.

The planarization layer 410 may be formed on the thin-film encapsulation layer 300, and may partially cover the thin-film encapsulation layer 300 in the non-display area NDA. The planarization layer 410 may cover the first and second partition wall PW1 and PW2 disposed between the first display element OLED1 and the second display element OLED2.

The planarization layer 410 may cover an area in which the organic encapsulation layer 320 of the thin-film encapsulation layer 300 is not present to constantly maintain flatness of an upper part of the planarization layer 410 of the display panel 10. Accordingly, the input sensing layer 40 (refer to FIG. 2A) and/or the optical functional layer 50 (refer to FIG. 2A) may be prevented from separating or deviating from the display panel 10, wherein the input sensing layer 40 and/or the optical functional layer 50 are directly formed on the display panel 10 or combined with the display panel 10 via an adhesive layer.

The planarization layer 410 may include a material identical to a material of the organic encapsulation layer 320 of the thin-film encapsulation layer 300. For example, a material of the planarization layer 410 may include a methacrylic-based resin, an isoprene-based resin, a vinyl-based resin, an epoxy-based resin, a urethane-based resin, a cellulose-based resin, a perylene-based resin, an imide-based resin, or a compound of two or more thereof. As an example, the planarization layer 410 and the organic encapsulation layer 320 may each include a monomer material of an acrylic-based resin.

For example, the planarization layer 410 may be formed through a process of locally applying a monomer material to the thin-film encapsulation layer 300 at a position corresponding to the non-display area NDA by using an ink-jet printing method, and then, radiating light in a particular wavelength band to the position to thereby harden the monomer material into a polymer.

Compared to a method of ultimately forming the planarization layer 410 locally only in the non-display area NDA by coating a whole surface including not only the non-display area NDA but also the second area DA with a photoresist, and then, performing exposure and development processes, the planarization layer 410, according to an exemplary embodiment of the present disclosure, may be manufactured by using less materials and less damage may occur to peripheral layers. Accordingly, the time and cost of manufacturing the display panel 10 may be reduced.

The planarization layer 410 may include an inclined surface tapered at both ends. The inclined surface of the ends of the planarization layer 410 formed by using the inkjet printing method may form an acute angle with an upper surface of the thin-film encapsulation layer 300 covering the planarization layer 410. For example, a taper angle of an end of the planarization layer 410 may be equal to or greater than about 0° and equal to or greater than about 15°. As a comparative example, when the planarization layer 410 is formed by coating the whole surface of the non-display NDA with a photoresist and performing exposure and development processes, the planarization layer 410 may include an inclined surface with a taper angle θ greater than or equal to 80°.

The planarization layer 410, according to an exemplary embodiment of the present disclosure, may have an inclined surface with a taper angle less than the taper angle of the planarization layer 410 formed by performing whole-surface coating with the photoresist and exposure and development processes. Accordingly, separation or detachment of the planarization layer 410 from layers below or on the planarization layer 410 may be minimized.

As described with reference to FIG. 3C, an upper surface of the thin-film encapsulation layer 300 below the planarization layer 410, e.g., the upper surface 3301 of the second inorganic encapsulation layer 330 may have a greater roughness value as a result of undergoing the surface treatment process (e.g.: an ashing process) using plasma. When surface treatment is performed on the upper surface of the thin-film encapsulation layer 300 to have a greater roughness value, a contact area with the planarization layer 410 increases. Thus, an adhesive force between the planarization layer 410 and the thin-film encapsulation layer 300 increases, and deviation or separation of the planarization layer 410 from the upper surface of the thin-film encapsulation layer 300 may be prevented.

Figure 3E:
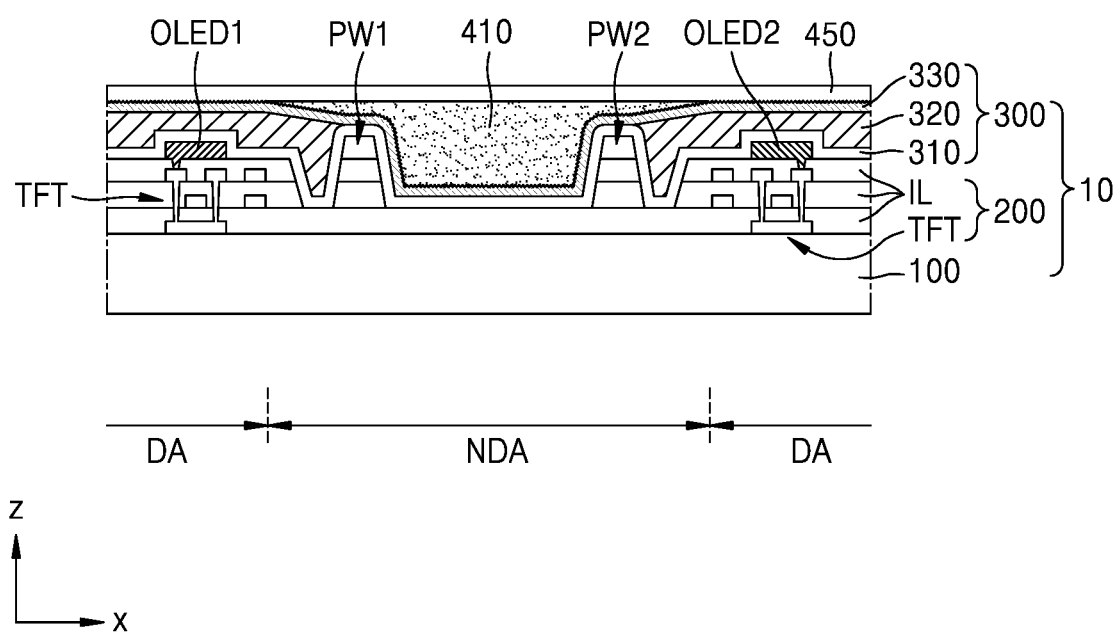

Then, in FIG. 3E, an upper insulating layer 450 may be formed on the planarization layer 410. The upper insulating layer 450 may include a single layer or multiple layers including an inorganic insulating layer and/or an inorganic insulating layer.

As an exemplary embodiment of the present disclosure, when the input sensing layer 40 (refer to FIG. 2A) is formed directly on the display panel 10, the upper insulating layer 450 may be formed integrally with an insulating layer included in the input sensing layer 40.

As a selective embodiment, the component 20 described above (e.g.: a sensor, a camera, a speaker, etc.) may be disposed in correspondence with the non-display area NDA.

Figure 3F:
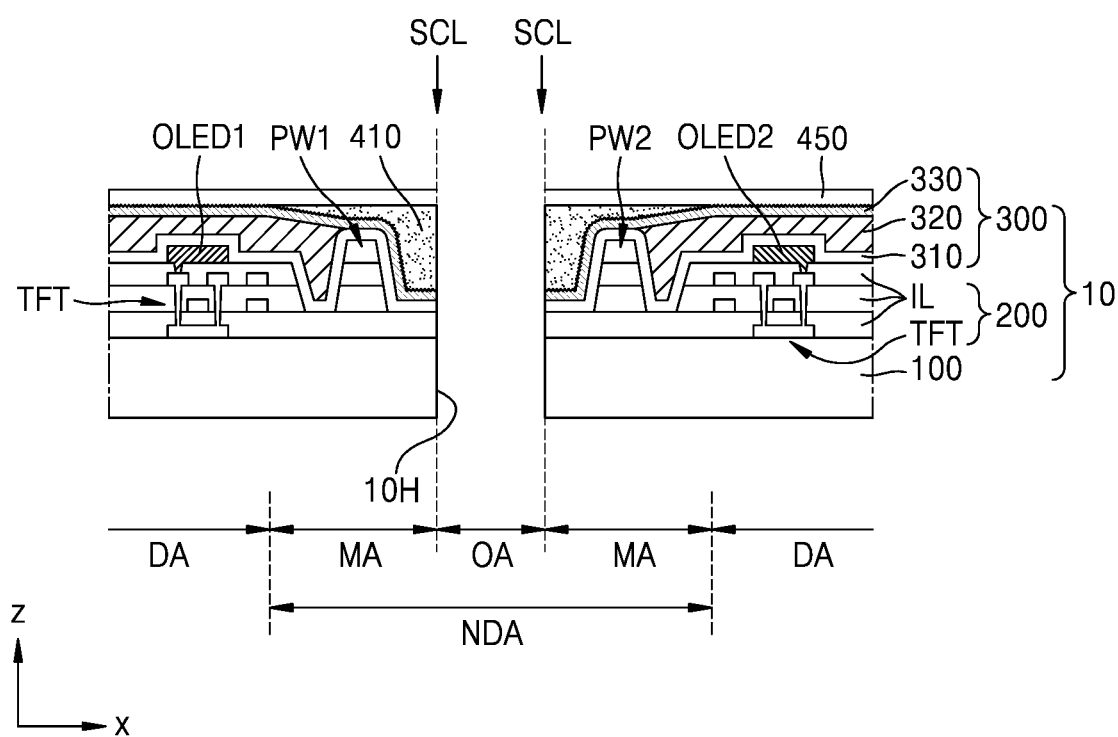

Then, in FIG. 3F, a first opening 10H may be formed at a position corresponding to the first area OA through a scribing or cutting process.

Referring to FIG. 3F, laser light may be radiated to the display panel 10 along an outer line SCL of the first area OA. By doing so, portions in the first area OA, for example, portions corresponding to the planarization layer 410, the first and second inorganic encapsulation layers 310 and 330 of the thin-film encapsulation layer 300, the at least one insulating layers IL and the upper insulating layer 450, and the first area OA of the substrate 100 may be removed. An area of the removed portions may constitute the first opening 10H.

The planarization layer 410 may be disposed in correspondence with the third area MA between the second area DA and the first area OA by performing the scribing or cutting process.

For example, the planarization layer 410 may be disposed exclusively in the third area MA. The planarization layer 410 may be formed, for example, to have a ring shape surrounding the first area OA at a position corresponding to the third area MA of FIG. 1.

As an embodiment, the component 20 described above (e.g.: a sensor, a camera, a speaker, etc.) may be disposed at a position corresponding to the first opening 10H in the first area OA.

Figure 4:
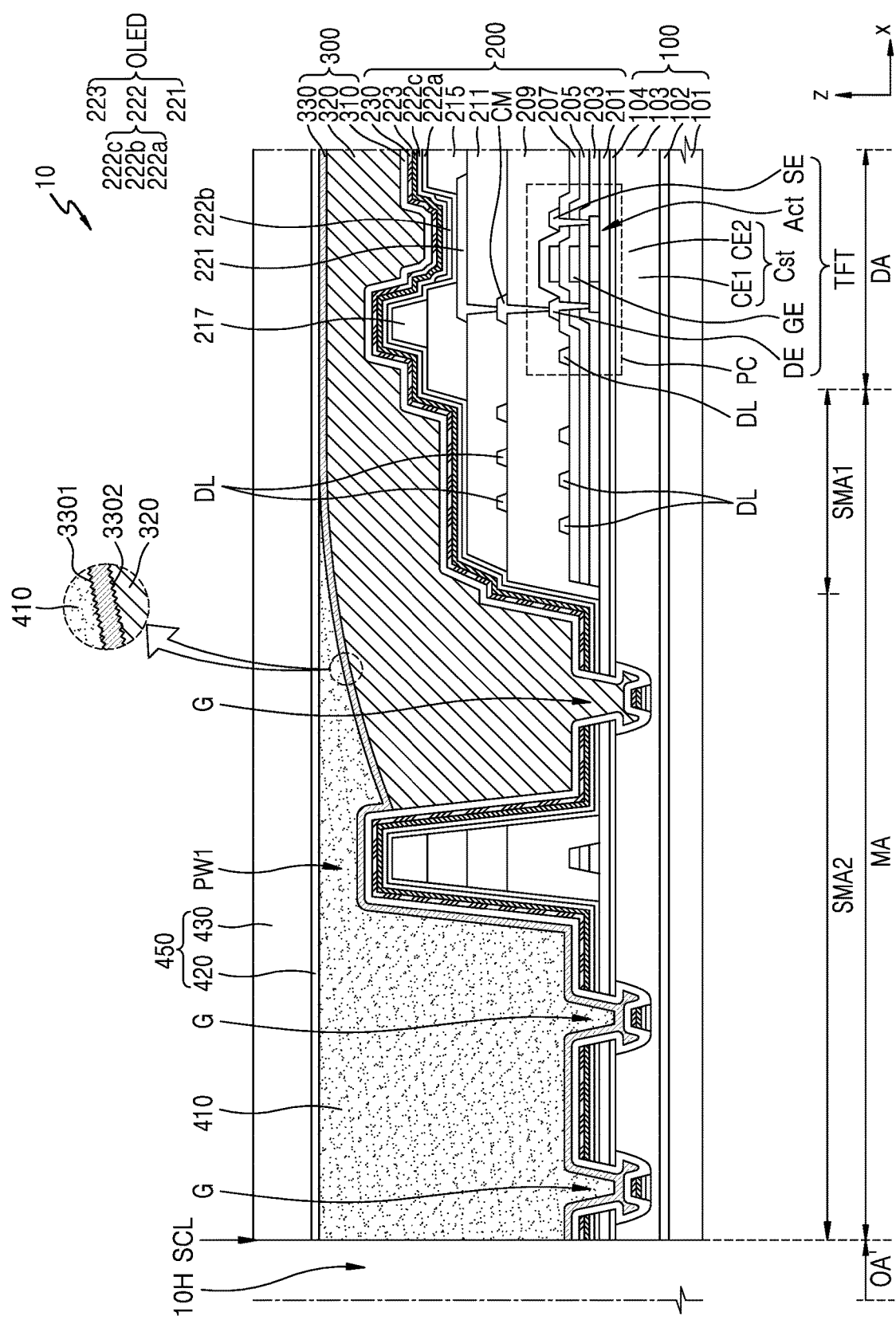
FIG. 4 is a cross-sectional view illustrating a display panel according to an exemplary embodiment of the present disclosure.
Figure 5:
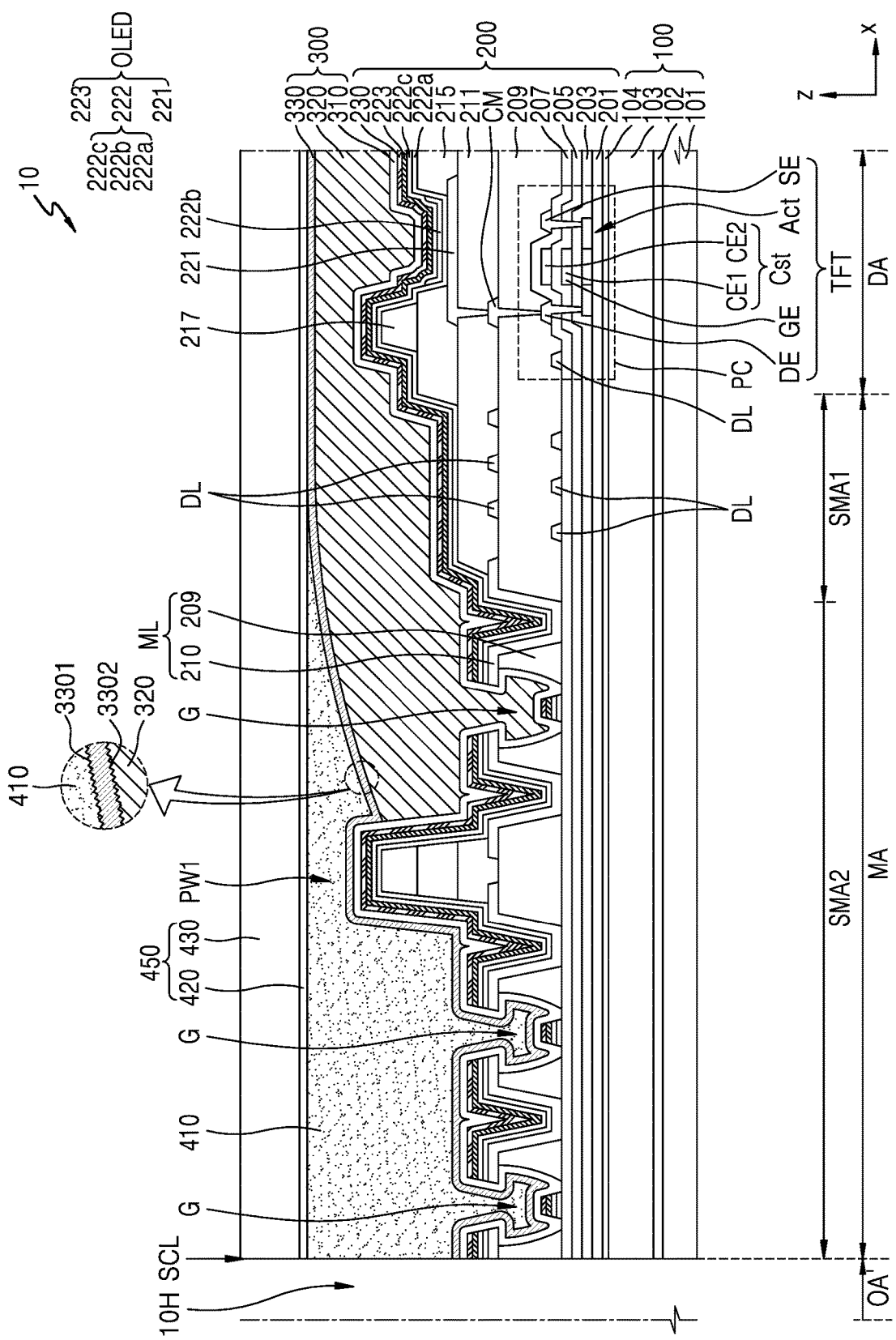
FIG. 5 is a cross-sectional view illustrating the display panel according to an exemplary embodiment of the present disclosure.

FIGS. 4 and 5 are cross-sectional views illustrating the display panel 10 according to an exemplary embodiment of the present disclosure. FIGS. 4 and 5 are detailed cross-sectional views illustrating an area between the first area OA and the second area DA of the display panel 10 formed by performing operations of FIGS. 3A to 3F.

Referring to FIGS. 4 and 5, the display panel 10 may include the first opening 10H, and the pixel circuit PC and a display element OLED, wherein the first opening 10H corresponds to the first area OA, a pixel circuit PC is disposed to correspond to the second area DA on the substrate 100, and the display element is connected to the pixel circuit PC.

The pixel circuit PC may include the thin-film transistor TFT and a storage capacitor Cst. The thin-film transistor TFT may include a semiconductor layer Act, a gate electrode GE, a source electrode SE, and a drain electrode DE.

The semiconductor layer Act may include polysilicon. Alternatively, the semiconductor layer Act may include amorphous silicon, an oxide semiconductor, an organic semiconductor, or the like. The gate electrode GE may include a low-resistance metal material. The gate electrode GE may include a conductive material including molybdenum (Mo), aluminum (Al), copper (Cu), titanium (Ti), or the like. The gate electrode GE may include a single layer or multiple layers including the above-described material.

A gate insulating layer 203 may be disposed between the semiconductor layer Act and the gate electrode GE. The gate insulating layer 203 may include an inorganic insulating material such as silicon oxide, silicon nitride, silicon oxynitride, aluminum oxide, titanium oxide, tantalum oxide, hafnium oxide, etc. The gate insulating layer 203 may include a single layer or multiple layers including the material described above.

The source electrode SE and the drain electrode DE may include a material with excellent conductivity. The source electrode SE and the drain electrode DE may include a conductive material including Mo, Al, Cu, Ti, or the like, and include a single layer or multiple layers including the above-described material. As an embodiment, the source electrode SE and the drain electrode DE may include multiple layers, for example, Ti/Al/Ti.

The storage capacitor Cst may include a lower electrode CE1 and an upper electrode CE2 overlapping each other to have a first interlayer insulating layer 205 therebetween. The storage capacitor Cst may overlap the thin-film transistor TFT. In relation to this, FIGS. 4 and 5 show that the gate electrode GE of the thin-film transistor TFT is the lower electrode CE1 of the storage capacitor Cst. However, in an exemplary embodiment of the present disclosure, the storage capacitor Cst might not overlap the thin-film transistor TFT. The storage capacitor Cst may be covered by a second interlayer insulating layer 207.

The first and second interlayer insulating layers 205 and 207 may include an inorganic insulating material such as silicon oxide, silicon nitride, silicon oxynitride, aluminum oxide, titanium oxide, tantalum oxide, hafnium oxide, etc. The first and second interlayer insulating layers 205 and 207 may include a single layer or multiple layers including the material described above.

The pixel circuit PC may be covered by a first organic insulating layer 209. The first organic insulating layer 209 may include an approximately flat upper surface.

The pixel circuit PC may be electrically connected to a pixel electrode 221. For example, as shown in FIGS. 4 and 5, a contact metal layer CM may be disposed between the thin-film transistor TFT and the pixel electrode 221.

The contact metal layer CM may be connected to the thin-film transistor TFT via a contact hole in the first organic insulating layer 209. The pixel electrode 221 may be connected to the contact metal layer CM via a contact hole in a second organic insulating layer 211 on the contact metal layer CM. The contact metal layer CM may include a conductive material including Mo, Al, Cu, Ti, or the like. The contact metal layer CM may include a single layer or multiple layers including the above-described material. As an embodiment, the contact metal layer CM may include multiple layers, for example, Ti/Al/Ti.

The first and second organic insulating layers 209 and 211 may include an organic insulating material such as a general-purpose polymer such as polymethyl methacrylate (PMMA) or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a blend thereof. As an embodiment, the first and second organic insulating layers 209 and 211 may include polyimide.

The pixel electrode 221 may be disposed on the second organic insulating layer 211. The pixel electrode 221 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an exemplary embodiment of the present disclosure, the pixel electrode 221 may include a reflective layer including silver (Ag), magnesium (Mg), Al, platinum (Pt), palladium (Pd), gold (Au), nickel (Ni), neodymium (Nd), iridium (Ir), chromium (Cr), or a compound thereof. In an exemplary embodiment of the present disclosure, the pixel electrode 221 may further include a layer including ITO, IZO, ZnO, or $In_2O_3$ above/below the reflective layer described above.

A pixel-defining layer 215 may be disposed on the pixel electrode 221. The pixel-defining layer 215 may include an opening exposing an upper surface of the pixel electrode 221, and cover an edge of the pixel electrode 221. The pixel-defining layer 215 may include an organic insulating layer. Alternatively, the pixel-defining layer 215 may include an inorganic insulating material such as silicon nitride ($SiN_x$), silicon oxynitride (SiON), and silicon oxide ($SiO_x$).

Alternatively, the pixel-defining layer 215 may include an organic insulating layer or an inorganic insulating layer.

The intermediate layer 222 may include an emission layer 222b. The intermediate layer 222 may include a first functional layer 222a below the emission layer 222b and/or a second functional layer 222c on the emission layer 222b. The emission layer 222b may include a polymer organic material or a low-molecular weight organic material emitting light of a certain color.

The first functional layer 222a may include a single layer or multiple layers. For example, when the first functional layer 222a includes the polymer organic material, the first functional layer 222a may have a single-layered structure including a hole transport layer (HTL), and include poly(3, 4-ethylene dioxythiophene) (PEDOT) or polyaniline (PANI). When the first functional layer 222a includes the low-molecular weight organic material, the first functional layer 222a may include a hole injection layer (HIL) and an HTL.

The display panel 10 may include or might not include the second functional layer 222c. For example, when the first functional layer 222a and the emission layer 222b include the polymer material, the display panel 10 may include the second functional layer 222c. The second functional layer 222c may include a single layer or multiple layers. The second functional layer 222c may include an electron transport layer (ETL) and/or an electron injection layer (EIL).

The emission layer 222b may be disposed in each of pixels in the second area DA. The emission layer 222b may be patterned to correspond to the pixel electrode 221. Unlike the emission layer 222b, the first functional layer 222a and/or the second functional layer 222c of the intermediate layer 222 may be present in the third area MA as well as the second area DA.

An opposite electrode 223 may include a conductive material having a low work function. For example, the opposite electrode 223 may include a (semi)transparent layer including Ag, Mg, Al, Pt, Pd, Au, Ni, Nd, Ir, Cr, lithium (Li), calcium (Ca), an alloy thereof, or the like. Alternatively, the opposite electrode 223 may further include a layer including ITO, IZO, ZnO, or $In_2O_3$, on the (semi)transparent layer including the material described above. The opposite electrode 223 may be disposed in the third area MA as well as the second area DA. The first functional layer 222a, the second functional layer 222c, and the opposite electrode 223 may be formed by using a thermal deposition method.

A capping layer 230 may be disposed on the opposite electrode 223. For example, the capping layer 230 may include lithium (LiF), and be formed by using the thermal deposition method. In some embodiments, the capping layer 230 might not be included.

A spacer 217 may be disposed on the pixel-defining layer 215. The spacer 217 may include an organic insulating material such as polyimide. Alternatively, the spacer 217 may include an inorganic insulating material, or an organic insulating material and an inorganic insulating material.

The spacer 217 may include a material different from that of the pixel-defining layer 215 or a material identical to that of the pixel-defining layer 215. For example, the pixel-defining layer 215 and the spacer 217 may be formed together in a mask process using a halftone mask. As an embodiment, the pixel-defining layer 215 and the spacer 217 may include polyimide.

The substrate 100 may include a glass material or a polymer resin. The substrate 100 may include multiple layers. For example, as shown in FIG. 4, the substrate 100 may include a first base layer 101, a first barrier layer 102, a second base layer 103, and a second barrier layer 104.

The first base layer 101 and the second base layer 103 may each include a polymer resin. For example, the first base layer 101 and the second base layer 103 may include polyethersulphone, polyarylate, polyetherimide, polyacrylate, polyethylene naphthalate, polyethylene terephthalate, polyphenylene sulfide, polyimide, PC, TAC, cellulose acetate propionate, or the like. The above-described polymer resin may be transparent.

The first barrier layer 102 and the second barrier layer 104 are barrier layers configured to prevent penetration of external foreign substances, and may include a single layer or multiple layers including an inorganic material such as $SiN_x$ or $SiO_x$.

On the substrate 100, a buffer layer 201 may be disposed, wherein the buffer layer 201 is provided to prevent penetration of impurities into the semiconductor layer Act of the thin-film transistor TFT. The buffer layer 201 may include an inorganic insulating layer such as $SiN_x$, $SiO_xN_y$, or $SiO_x$, and include a single layer or multiple layers including the inorganic insulating material described above.

Referring to FIGS. 4 and 5, the third area MA may include a first sub-intermediate area SMA) comparatively adjacent to the second area DA and a second sub-intermediate area SMA2 comparatively adjacent to the first area OA.

The first sub-intermediate area SMA1 may be an area through which a plurality of wires such as a data line, a scan line, etc. pass. For example, FIGS. 4 and 5 illustrate a structure in which data lines DL pass through the first sub-intermediate area SMA1. For example, the data line DL may bypass the first area OA, be electrically connected to pixels in the second area DA, and provide a data signal to each of the pixels.

The second sub-intermediate area SMA2 may be an area in which grooves G are disposed. The display panel 10 may include at least one groove G in the second sub-intermediate area SMA2.

The groove G may be formed on a multi-layered film ML disposed between the substrate 100 and the pixel electrode 221. The multi-layered film ML may include a first sub-layer including an organic layer and a second sub-layer including an inorganic layer. For example, a hole penetrating the second sub-layer may be spatially connected to a recess provided in the first sub-layer to constitute the groove G. A width of the recess in the first sub-layer may be greater than a width of the hole in the second sub-layer. The groove G may have an undercut cross-section.

According to an example, as shown in FIG. 4, the multi-layered film ML constituting the groove G may include some of layers of the substrate 100, e.g., the second base layer 103 and the second barrier layer 104.

In FIG. 4. the second base layer 103 corresponds to the first sub-layer of the multi-layered film ML, and the second barrier layer 104 may correspond to the second sub-layer of the multi-layered film ML. A portion of the buffer layer 201 on the second barrier layer 104 may be removed together with the second barrier layer 104 in a process of forming the groove G.

According to an exemplary embodiment of the present disclosure, as shown in FIG. 5, the multi-layered film ML constituting the groove G may include the first organic insulating layer 209 and an inorganic layer 210 on the first organic insulating layer 209.

The inorganic layer 210 may be disposed on a layer identical to that of the contact metal layer CM, e.g., on the first organic insulating layer 209. The inorganic layer 210 may be formed through a mask process identical to that of the contact metal layer CM. The inorganic layer 210 may include a material identical to a material of the contact metal layer CM. For example, the inorganic layer 210 may include metal. The inorganic layer 210 may include three sub-layers, for example, Ti/Al/Ti.

The groove G may be formed before a process of forming the intermediate layer 222 is performed. Some organic layers of the intermediate layer 222, e.g., the first and/or second functional layers 222a and/or 221c, may extend from the second area DA toward the third area MA and be disconnected by the groove G. The opposite electrode 223 and/or the capping layer 230 on the intermediate layer 222 may extend from the second area DA toward the third area MA and be disconnected with reference to the groove G.

As shown in FIGS. 4 and 5, when the display panel 10 includes a plurality of grooves G, the grooves G may be spaced apart from each other. In a plan view of the display panel 10, each of the grooves G may be disposed in the third area MA to have a ring shape surrounding the first area OA.

The thin-film encapsulation layer 300 may cover the second area DA. The first and second inorganic encapsulation layers 310 and 330 may extend from the second area DA toward the third area MA to cover the third area MA as well as the second area DA.

The first and second inorganic encapsulation layers 310 and 330 may be formed by using a chemical vapor deposition (CVD) method, etc., and may have excellent step coverage compared to a portion of the intermediate layer 222 (the first and second functional layers 222a and 221c) or the opposite electrode 223. Accordingly, the first and second inorganic encapsulation layers 310 and 330 might not be disconnected by the groove G but may be continuously formed. For example, the first inorganic encapsulation layer 310 may cover an inner surface of the groove G.

The organic encapsulation layer 320 may cover the second area DA, and an end of the organic encapsulation layer 320 may be disposed at a side of the first partition wall PW1. For example, the organic encapsulation layer 320 may be formed by applying and hardening a monomer-based material. In the forming of the organic encapsulation layer 320, due to the first partition wall PW1 in the second sub-intermediate area SMA2, the monomer-based material might not flow into the first area OA.

The first partition wall PW1 may include a plurality of layers.

FIG. 4 illustrates that the first partition wall PW1 includes a stack structure of layers including a material identical to that of the gate insulating layer 203, the first interlayer insulating layer 205, and the second interlayer insulating layer 207, and layers including a material identical to that of the first organic insulating layer 209, the second organic insulating layer 211, the pixel-defining layer 215, and the spacer 217. FIG. 5 illustrates that the first partition wall PW1 includes a stack structure of layers including a material identical to that of the first organic insulating layer 209, the second organic insulating layer 211, the pixel-defining layer 215, and the spacer 217. However, in an exemplary embodiment of the present disclosure, the number of layers of the first partition wall PW1 may be greater or less than the number of layers of the circuit layer 200 of FIG. 4 or 5.

FIGS. 4 and 5 illustrate that only one partition wall is provided. However, in a cross-sectional view of the display panel 10 from the component area OA to a portion of the display area DA, the display panel 10 may include a plurality of partition walls.

The planarization layer 410 may be disposed on the thin-film encapsulation layer 300. The planarization layer 410 may be formed on an upper surface of the second inorganic encapsulation layer 330 of the thin-film encapsulation layer 300 having a relatively large roughness by performing surface treatment. For example, the upper surface of the second inorganic encapsulation layer 330 may have an RMS roughness value equal to or greater than about 25 Å and equal to or less than about 35 Å.

The upper insulating layer 450 including a first upper insulating layer 420 and a second upper insulating layer 430 may be disposed on the planarization layer 410. For example, the first upper insulating layer 420 may include an inorganic insulating layer, and the second upper insulating layer 430 may include an organic insulating layer.

Figure 6:
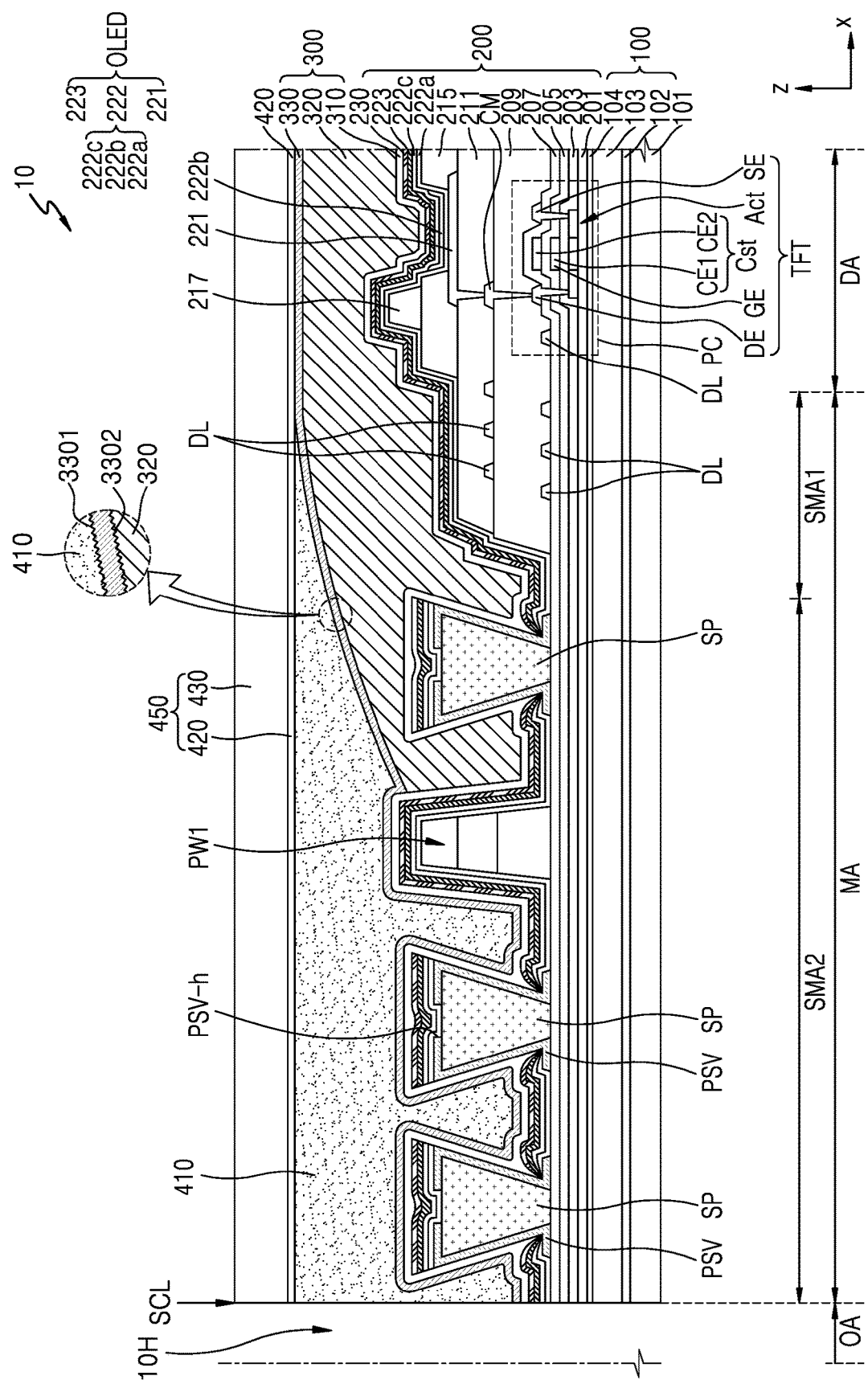
FIG. 6 is a cross-sectional view illustrating a display panel according to an exemplary embodiment of the present disclosure.

FIG. 6 is a cross-sectional view of the display panel 10 according to an exemplary embodiment of the present disclosure. The display panel 10 of FIG. 6 may have a structure similar to the display panel 10 described above with reference to FIGS. 4 and 5. Thus, hereinafter, a difference from the display panel 10 of FIG. 6 and the display panel 10 of FIGS. 4 and 5 is described.

Referring to FIG. 6, separators SP may be disposed in the third area MA. The separator SP may include a portion having a reversed trapezoid shape with an upper part having a greater width than a lower part. For example, a side surface of the separator SP may include a reverse-tapered inclined surface.

The separator SP may be disposed on an insulating layer over the substrate 100, e.g., on the second interlayer insulating layer 207. The separator SP may disconnect or separate at least a portion of an organic material layer in the intermediate layer 222, e.g., the first functional layer 222a extending from the second area DA to the third area MA, and/or the second functional layer. The opposite electrode 223 and/or the capping layer 230 may also extend from the second area DA to the third area MA and be disconnected or separated by the separator SP.

The separator SP may include an organic material. For example, the separator SP may include an organic material different from that of the first organic insulating layer 209 and the second organic insulating layer 211. The separator SP may include a photosensitive resin, e.g., negative photoresist.

The separator SP may be covered by an inorganic material layer PSV. The inorganic material layer PSV may include at least one hole PSV-h corresponding to an upper surface of the separator SP.

The hole PSV-h may be a path via which gas is discharged, wherein the gas is generated from the separator SP including an inorganic material in a manufacture process of the display panel 10 and/or after the display panel 10 is manufactured. For example, the hole PSV-h may be an outgassing path.

A body of the inorganic material layer PSV, other than the hole PSV-h, may cover a portion of the upper surface SP-T of the separator SP and a side surface of the separator SP. The body of the inorganic material layer PSV may extend from the upper surface SP-T to cover the side surface SP-L of the separator SP, and may be in contact with an insulating layer disposed below the separator SP, e.g., an upper surface of the second interlayer insulating layer 207.

After the separator SP and the inorganic material layer PSV are formed, the first functional layer 222a, the second functional layer 222c, and the opposite electrode 223 and/or the capping layer 230 may be formed. The first functional layer 222a, the second functional layer 222c, and the opposite electrode 223, and/or the capping layer 230 may be formed respectively integrally in the second area DA and the third area MA. Since the separator SP is disposed in the third area MA, the first functional layer 222a and/or the second functional layer 222c may be disconnected with reference to the separator SP. Likewise, the opposite electrode 223 may be disconnected with reference to the separator SP. In addition, the capping layer 230 including a material such as LiF may be also disconnected with reference to the separator SP.

Among layers over the substrate 100, layers including an organic material may be a moisture penetration path of a foreign substance such as moisture. The foreign substance such as moisture may damage the display element OLED. However, since the first functional layer 222a and/or the second functional layer 222c that are organic layers are disconnected by the groove G of FIGS. 4 and 5 or the separator SP of FIG. 6, progress of moisture in a direction parallel with the upper surface of the first functional layer 222a and/or the second functional layer 222c (a side direction or an x-direction) may be minimized.

According to various embodiments, a display apparatus may be manufactured by reducing manufacture time and cost, and a display apparatus with an enhanced reliability may be provided.

It should be understood that the descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A display apparatus, comprising:
a substrate comprising a first area, a second area at least partially surrounding the first area, and a third area disposed between the first area and the second area;
a plurality of display elements disposed in the second area, the plurality of display elements comprising at least a first display element and a second display element spaced apart from each other;
a thin-film encapsulation layer comprising an organic encapsulation layer at least partially covering the plurality of display elements, and an inorganic encapsulation layer disposed on the organic encapsulation layer; and
a planarization layer partially covering the thin-film encapsulation layer in the third area,
wherein the inorganic encapsulation layer comprises a first surface facing the planarization layer and a second surface facing in a direction opposite to the first surface, and
wherein the first surface has a roughness that is greater than a roughness of the second surface.

2. The display apparatus of claim 1, wherein the planarization layer comprises a material identical to a material of the organic encapsulation layer.

3. The display apparatus of claim 1, wherein a root-mean-square (RMS) roughness of the first surface is within a range of from about 25 Å to about 35 Å, inclusive.

4. The display apparatus of claim 1, wherein a taper angle of an end of the planarization layer is within a range from about 0° to about 15°, inclusive.

5. The display apparatus of claim 1, wherein the planarization layer and/or the organic encapsulation layer comprises an acrylic-based resin, a methacrylic-based resin, an isoprene-based resin, a vinyl-based resin, an epoxy-based resin, a urethane-based resin, a cellulose-based resin, a perylene-based resin, an imide-based resin, or a compound of two or more of these resins.

6. The display apparatus of claim 1, further comprising a partition wall disposed between the first display element and the second display element in the third area,
wherein the planarization layer at least partially covers the partition wall.

7. The display apparatus of claim 1, wherein the substrate comprises an opening disposed in the first area.

8. The display apparatus of claim 1, further comprising at least one groove disposed in the third area,
wherein the planarization layer at least partially covers the at least one groove.

9. The display device of claim 8, wherein
each of the first display element and the second display element comprises a pixel electrode, an opposite electrode, and an intermediate layer disposed between the pixel electrode and the opposite electrode, and
at least one of the opposite electrode and an organic material layer in the intermediate layer extends in a direction toward the third area and is disconnected or separated by the at least one groove.

10. The display apparatus of claim 1, further comprising a separator disposed in the third area and having a reverse-tapered inclined surface,
wherein each of the first display element and the second display element comprises a pixel electrode, an opposite electrode, and an intermediate layer disposed between the pixel electrode and the opposite electrode, and
wherein at least one of the opposite electrode and an organic material layer in the intermediate layer extends toward the third area and is disconnected or separated by the separator.

11. A method of forming a display apparatus, comprising a first area, a second area at least partially surrounding the first area, and a third area disposed between the first area and the second area, the method comprising:
forming a plurality of display elements in a position corresponding to the second area of a substrate;
forming a thin-film encapsulation layer comprising an organic encapsulation layer and an inorganic encapsulation layer on the organic encapsulation layer to cover the plurality of display elements;
performing surface treatment on an upper surface of the inorganic encapsulation layer by using plasma; and
forming a planarization layer in the third area by using an ink-jet printing method.

12. The method of claim 11, wherein
the inorganic encapsulation layer comprises a first surface facing the planarization layer and a second surface facing in a direction opposite to the first surface, and
the first surface has a roughness that is greater than a roughness of the second surface.

13. The method of claim 12, wherein a root-mean-square (RMS) roughness of the first surface is within a range of from about 25 Å to about 35 Å, inclusive.

14. The method of claim 11, wherein an end of the planarization layer is formed such that that a taper angle of an inclined surface is within a range of about 0° to about 15°, inclusive.

15. The method of claim 11, wherein the planarization layer comprises an acrylic-based resin, a methacrylic-based resin, an isoprene-based resin, a vinyl-based resin, an epoxy-based resin, a urethane-based resin, a cellulose-based resin, a perylene-based resin, an imide-based resin, or a compound of two or more of these resins.

16. The method of claim 11, wherein the planarization layer comprises a material identical to a material of the organic encapsulation layer.

17. The method of claim 11, further comprising forming an opening in the substrate to correspond to the first area.

18. The method of claim 17, wherein the forming of the opening is performed after the forming of the planarization layer is performed.

19. The method of claim 18, wherein the forming of the opening comprises radiating laser light along an outer portion of the first area.

20. The method of claim 11, wherein the planarization layer is disposed in the third area.

* * * * *